United States Patent
Wang et al.

(10) Patent No.: US 6,819,137 B1
(45) Date of Patent: Nov. 16, 2004

(54) TECHNIQUE FOR VOLTAGE LEVEL SHIFTING IN INPUT CIRCUITRY

(75) Inventors: Yueyong Wang, Santa Clara, CA (US); Jade Kizer, Mountain View, CA (US); Chanh Tran, San Jose, CA (US); Benedict Lau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/237,963

(22) Filed: Sep. 10, 2002

Related U.S. Application Data

(63) Continuation-in-part of application No. 09/849,755, filed on May 4, 2001, now Pat. No. 6,600,338.

(51) Int. Cl.[7] .................. H03K 19/094; H03K 19/0175
(52) U.S. Cl. .......................................... 326/68; 326/63
(58) Field of Search ............................ 326/63, 68, 70, 326/71, 73, 74, 81

(56) References Cited

U.S. PATENT DOCUMENTS

| | | | |
|---|---|---|---|
| 5,148,059 A | * | 9/1992 | Chen et al. .................... 326/66 |
| 5,148,061 A | * | 9/1992 | Hsueh et al. .................. 326/66 |
| 5,315,179 A | * | 5/1994 | Pelley et al. ................... 326/64 |
| 5,465,057 A | * | 11/1995 | Takahashi ..................... 326/66 |
| 5,534,795 A | | 7/1996 | Wert et al. |
| 5,534,798 A | | 7/1996 | Phillips et al. |
| 5,663,663 A | | 9/1997 | Cao et al. |
| 5,751,168 A | | 5/1998 | Speed, III et al. |
| 5,757,712 A | | 5/1998 | Nagel et al. |
| 5,867,010 A | | 2/1999 | Hinedi et al. |
| 5,973,508 A | | 10/1999 | Nowak et al. |
| 5,986,472 A | | 11/1999 | Hinedi et al. |
| 6,097,215 A | | 8/2000 | Bialas, Jr. et al. |
| 6,160,421 A | | 12/2000 | Barna |
| 6,323,683 B1 | * | 11/2001 | Katikaneni .................... 326/66 |
| 6,600,338 B1 | * | 7/2003 | Nguyen et al. ................ 326/68 |

OTHER PUBLICATIONS

R DRAM, Direct Rambus Clock Generator, pp. 1–22.
PCI Local Bus, PCI Local Bus Specification, Dec. 18, 1998, pp. 1–302.
R DRAM, Direct Rambus Clock Generator, pp. 1–22, Apr. 2002.
PCI Local Bus, PCI Local Bus Specification, Dec. 18, 1998, pp. 1–302.

* cited by examiner

Primary Examiner—Daniel D. Chang
(74) Attorney, Agent, or Firm—Hunton & Williams LLP

(57) ABSTRACT

A technique for voltage level shifting in input circuitry is disclosed. In one exemplary embodiment, the technique may be realized as a method for voltage level shifting input signals. This method may comprise receiving first and second input signals having first and second voltage levels, respectively, and then differentially amplifying the first and second input signals so as to generate first and second amplified voltage signals having first and second amplified voltage levels, respectively, wherein the first and second amplified voltage signals are substantially complementary. This method may then comprise reducing the first and second amplified voltage levels of the first and second amplified voltage signals so as to generate first and second level shifted amplified voltage signals having first and second level shifted amplified voltage levels, respectively.

24 Claims, 10 Drawing Sheets

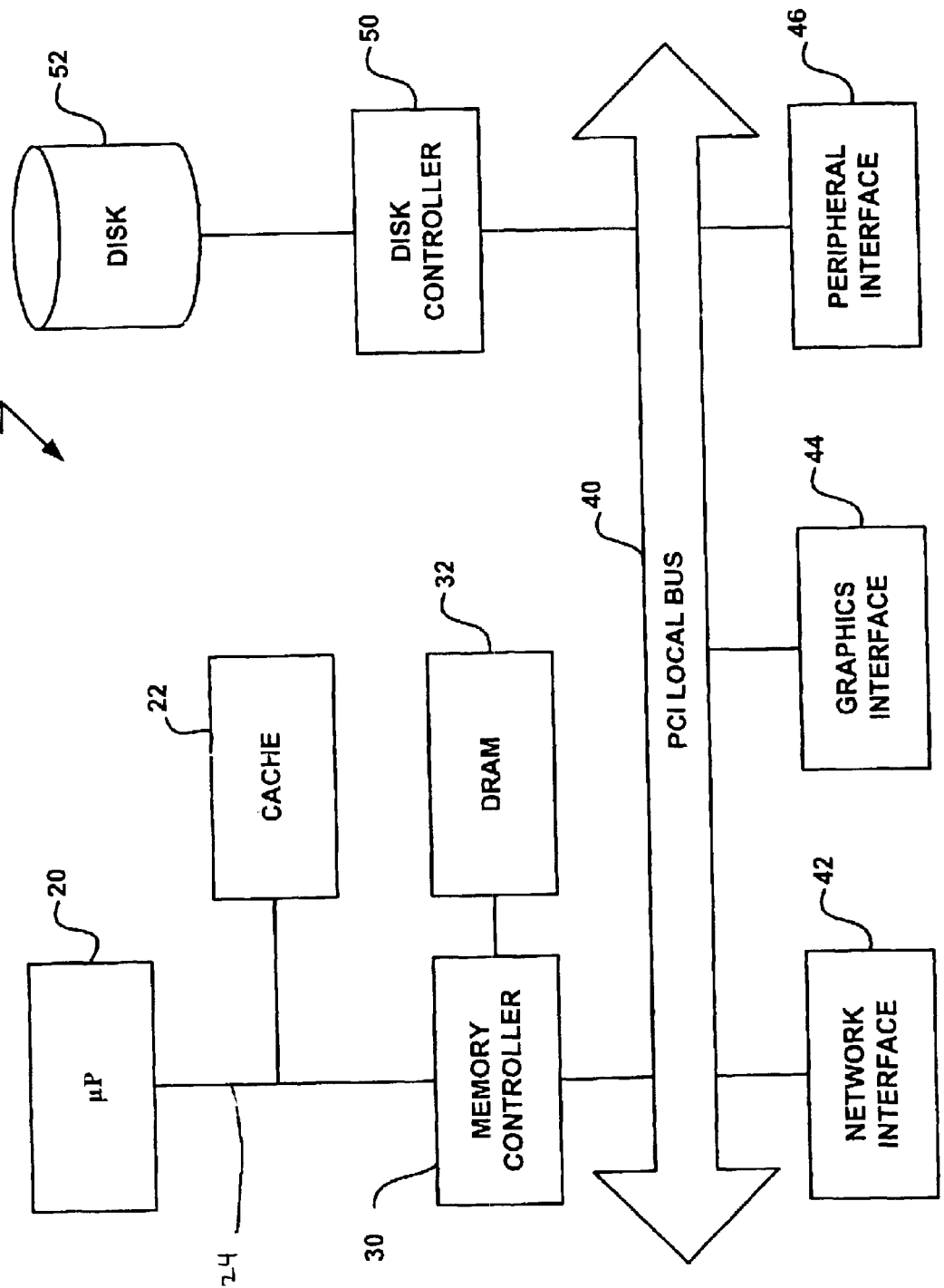

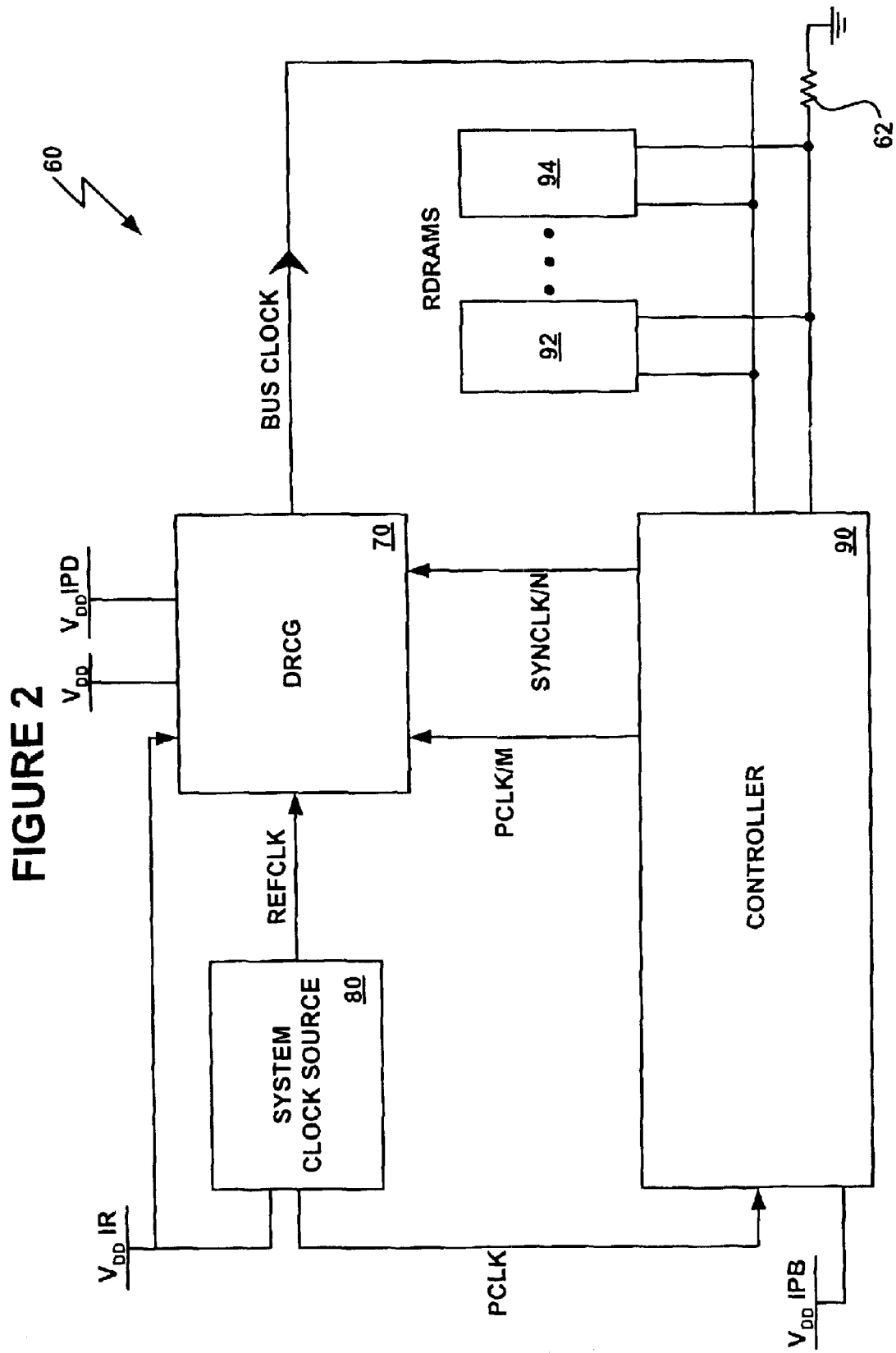

TECHNIQUE FOR VOLTAGE LEVEL SHIFTING IN INPUT CIRCUITRY

CROSS-REFERENCE TO RELATED APPLICATIONS

This patent application is a continuation-in-part of U.S. patent application Ser. No. 09/849,755, filed May 4, 2001, now U.S. Pat. No. 6,600,338, which is hereby incorporated by reference herein in its entirety.

FIELD OF THE INVENTION

The present invention relates generally to digital interface circuitry and, more particularly, to a technique for voltage level shifting in input circuitry.

BACKGROUND OF THE INVENTION

As digital circuitry and systems have evolved, they have been designed to utilize steadily lower supply voltage levels. For example, early Transistor-Transistor-Logic (TTL) digital logic circuits typically operated from a 5 volt (V) power supply. As the need for power efficiency has grown, primarily with respect to mobile devices, the typical power supply voltage for devices dropped to 3V, and now devices designed to operate from 1.8V supply levels dominate the market. Also, as the transistor geometries for integrated circuit technology have dropped, some devices are unable to operate using higher voltage supply levels. Further, lower voltage levels reduce output voltage swings and, consequently, the noise produced circuits.

However, many architectural standards, such as bus standards, were developed when a different logical voltage level was the norm. Also, systems may incorporate devices having different supply voltage requirements. For example, a system may include a processor, memory controller, and memory that are designed to operate using 1.8V, while the system bus may be designed to operate using 3.3V. To alleviate this problem, some systems are designed to support several different voltage levels. For example, the Peripheral Control Interface (PCI) local bus is designed to operate using both 5V and 3.3V signaling levels. See the PCI Local Bus Specification version 2.2, which is hereby incorporated by reference herein in its entirety.

FIG. 1 illustrates an example of a system architecture 10 utilizing a PCI local bus 40. A microprocessor 20 directly interfaces to a cache 22 and memory controller 30 via a processor bus 24. Memory controller 30 also interfaces to a dynamic random access memory (DRAM) device 32 and to PCI local bus 40. The memory controller 30 provides a bridge to the PCI bus from the processor bus 24 and handles access to DRAM 32 and to devices coupled to PCI local bus 40 for the processor 20. System architecture 10 includes a representative selection of peripheral devices such as, for example, a network interface 42 for communications with an external network such as a local area network (LAN), a graphics interface 44 for driving a video output, a peripheral interface 46 for interfacing to other peripheral devices, such as keyboards, modems, etc., and a disk controller 50 for controlling bulk storage to disk 52.

Today, processor 20, cache 22, memory controller 30, and DRAM 32 are often designed for use with a 1.8V supply. However, as noted above, the PCI standard currently calls for logic signaling levels based on 3.3V or 5V. This raises the problem of interfacing between devices operating using different supply levels.

Systems may incorporate devices operating from a variety of supply sources having different levels. FIG. 2 is a diagram of a Rambus clock generation architecture 60, wherein a system clock source 80 operating from voltage supply $V_{DD}IR$ (e.g., 3V) produces a reference clock signal REF-CLK that is input to a Direct Rambus Clock Generator (DRCG) circuit 70. The DRCG circuit 70 is operating from another voltage supply $V_{DD}$ (e.g., 1.8V) and producing a bus clock signal BUS CLOCK, which is based on a Rambus Signal Level (RSL) using supply voltage $V_{DD}IPD$ (e.g., 1.8V), which results in a signal voltage swing between 1.0V and 1.8V. The bus clock signal BUS CLOCK, in turn, drives Rambus DRAMs (RDRAMs) 92–94, which are controlled by memory controller 90 through the use of a termination resistor 62. See Direct Rambus Clock Generator, Document DL-0056, Version 1.2, Rambus Inc., November 2000, which is hereby incorporated by reference herein in its entirety.

In order to deal with voltage differences between external signal levels (e.g., the bus clock signal BUS CLOCK operating between 1.0V and 1.8V) and internal voltage levels (e.g., the memory controller 90 typically operating below 1.8V), an input level shifter stage is typically used. FIG. 3 illustrates one example of an input level shifter circuit relating to the clock generation architecture 60 of FIG. 2. An output pin of clock source 80 includes an output driver 82 that operates from the supply voltage $V_{DD}IR$, which typically ranges from 1.3V to 3.3V. The output signal from output driver 82 reflects the voltage level of $V_{DD}IR$. The output driver 82 drives an input pin of DRCG circuit 70, which includes an input comparator 72 that operates from supply voltage $V_{DD}IPD$. DRCG circuit 70 also has an input that receives $V_{DD}IR$, which is divided by resistors 74 and 76 to obtain a threshold voltage that is input to comparator 72. Comparator 72 compares the voltage signal received from output driver 82 with the threshold voltage obtained by dividing $V_{DD}IR$ in order to generate a received signal having logic voltage levels that reflect the voltage level $V_{DD}IPD$.

Conventional input level shifters appear in a variety of forms, such as an operational amplifier network, a resistive divider network, or a source follower. FIG. 3 illustrates an example of a combination resistive divider and operational amplifier, where comparator 72 is implemented as an operational amplifier. FIG. 4 illustrates an example of a source follower input circuit 100 comprising a transistor 102, an input resistor 104, and a source resistor 106. In source follower circuit 100, a higher voltage signal received at $D_{IN}$ is reflected at the source of transistor 102, which is coupled to $D_{out}$, while the drain of transistor 102 is coupled to a supply voltage $V_{DD}I$. The magnitude of the voltage being shifted in source follower circuit 100 is determined by the threshold voltage of transistor 102.

A variety of other conventional level shifter circuits are shown in U.S. Pat. Nos. 6,160,421; 6,097,215; 5,986,472; 5,973,508; 5,867,010; 5,757,712; 5,751,168; 5,663,663; 5,534,798; and 5,534,795, all of which are hereby incorporated by reference herein in their entirety.

Conventional level shifters have a limited ability to shift from an external voltage level to an internal voltage level.

Source follower circuits are dependent on the transistor threshold voltage $V_t$ and tolerate only a narrow range between the external voltage level and the internal supply voltage. Consequently, source follower circuits must be tuned to each particular application and technology, and in general will affect the yield of silicon (product). In addition, source follower circuits do not provide gain for input signals. In resistive divider circuits, the ratio of the resistors must be selected for the relationship between the external and internal voltage sources for the particular application and technology and, as a result, cannot tolerate much variation in the external supply voltage. Also, the introduction of resistance to the receive path will slow the response of the circuit making resistive dividers unsuitable for high speed applications.

Operational amplifier based circuits can be configured to introduce gain to the input signal path. However, the gain of the operational amplifier is determined by the ratio of the feedback resistance to the input resistance for the amplifier. This ratio is fixed and must be designed for a specific ratio of external to internal voltage levels. The resistance also tends to slow the circuit, resulting in poor high speed performance. For a differential input amplifier circuit, since transistors must generally be stacked and use a low internal voltage supply level (e.g., $V_{DD}$ less than $2V_t$), the differential pair of the amplifier will typically run out of headroom to operate. In other words, the supply voltage level typically becomes insufficient to accommodate the output swing of the circuit without introducing distortion. For a single-ended input amplifier circuit, the gain offset can become quite large because the current source for the circuit may be pushed into its linear operating region. This causes distortion of the output signal for the receiver, such as duty cycle error. This occurs because there is a higher gain level when the data signal is higher, but a lower gain level when the reference voltage for the circuit is higher, since the reference voltage is less than the peak amplitude of the data.

FIG. 5 is a waveform diagram illustrating an example of the distortion that can occur due to a lack of operating headroom in a conventional receiver that utilizes a source follower to perform level shifting. In FIG. 5, waveform 110 represents a reference voltage for an input data signal represented by waveform 112. In this example, reference voltage 110 is approximately 1.4V and data signal 112 varies from 1.0V to 1.8V, which represents an RSL signal level. Likewise, waveform 114 represents a level shifted reference voltage for a level shifted data signal 116 that results from the level shifting of data signal 112. Waveform 120 represents the output voltage waveform of a gain stage that results from the input data signal 112 after it has been level shifted and amplified in a circuit having inadequate headroom.

Waveform 120 exhibits distortion due to voltage undershoot (illustrated at 122) and a flattening of the waveform (illustrated at 124) due to lack of headroom in the circuit. These occur because the performance of a traditional level shifter (e.g., a source follower) depends on the threshold levels of transistors. When designers do not have control over process and technology, a traditional level shifter tends to either level shift too much or not enough. If it shifts too much, the next stage (e.g., a gain stage) will not have enough headroom. On the other hand, if it does not shift enough, there is a gate stress problem for the following stage.

Thus, a need remains for an input circuit that operates at low supply voltage levels and is capable of level shifting higher voltage input signals with minimal distortion.

SUMMARY OF THE INVENTION

According to the present invention, a technique for voltage level shifting in input circuitry is provided. In one exemplary embodiment, the technique may be realized as a pseudo folded cascode level shifting circuit. The pseudo folded cascode level shifting circuit may comprise a differential amplifier having first and second input terminals, first and second current sinking terminals, and first and second current sourcing terminals, wherein the first and second input terminals may receive first and second input signals, respectively. The pseudo folded cascode level shifting circuit may also comprise a first current source having a control terminal for receiving a first bias control signal, and a current sinking terminal coupled to the first and second current sourcing terminals of the differential amplifier. The pseudo folded cascode level shifting circuit may further comprise a second current source having a control terminal for receiving a second bias control signal, a current sinking terminal coupled to a power supply, and a current sourcing terminal coupled to the first current sinking terminal of the differential amplifier. The pseudo folded cascode level shifting circuit may additionally comprise a third current source having a control terminal for receiving the second bias control signal, a current sinking terminal coupled to the power supply, and a current sourcing terminal coupled to the second current sinking terminal of the differential amplifier. The pseudo folded cascode level shifting circuit may still further comprise a first transistor having a control terminal for receiving a third bias control signal, a current sinking terminal coupled to the current sourcing terminal of the second current source and to the first current sinking terminal of the differential amplifier, and a current sourcing terminal. The pseudo folded cascode level shifting circuit may still additionally comprise a second transistor having a control terminal for receiving the third bias control signal, a current sinking terminal coupled to the current sourcing terminal of the third current source and to the second current sinking terminal of the differential amplifier, and a current sourcing terminal. The pseudo folded cascode level shifting circuit may even further comprise a first load coupled to the current sourcing terminal of the first transistor, and a second load coupled to the current sourcing terminal of the second transistor.

In another exemplary embodiment, the technique may be realized as a method for voltage level shifting input signals. This method may comprise receiving first and second input signals having first and second voltage levels, respectively, and then differentially amplifying the first and second input signals so as to generate first and second amplified voltage signals having first and second amplified voltage levels, respectively, wherein the first and second amplified voltage signals are substantially complementary. This method may then comprise reducing the first and second amplified voltage levels of the first and second amplified voltage signals so as to generate first and second level shifted amplified voltage signals having first and second level shifted amplified voltage levels, respectively.

In yet another exemplary embodiment, the technique may be realized as another method for voltage level shifting input signals. This method may comprise receiving first and second input voltage signals having first and second input voltage levels, respectively, wherein the first and second input voltage signals are substantially complementary. This method may then comprise converting the first and second input voltage signals into first and second current signals having first and second current levels, respectively, wherein the first and second current signals are substantially complementary. This method may then comprise converting the first and second current signals into first and second output voltage signals having first and second output voltage levels, respectively, wherein the first and second output voltage signals are substantially complementary and the first and second output voltage levels are lower than the first and second input voltage levels, respectively.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 1 is a functional block diagram illustrating an example of a system architecture employing devices that may operate with a variety of logic voltage levels and power supply levels.

FIG. 2 is a functional block diagram illustrating another example of a system architecture employing devices that may operate with a variety of logic voltage levels and power supply levels.

DETAILED DESCRIPTION OF EXEMPLARY EMBODIMENT(S)

Figure 4:
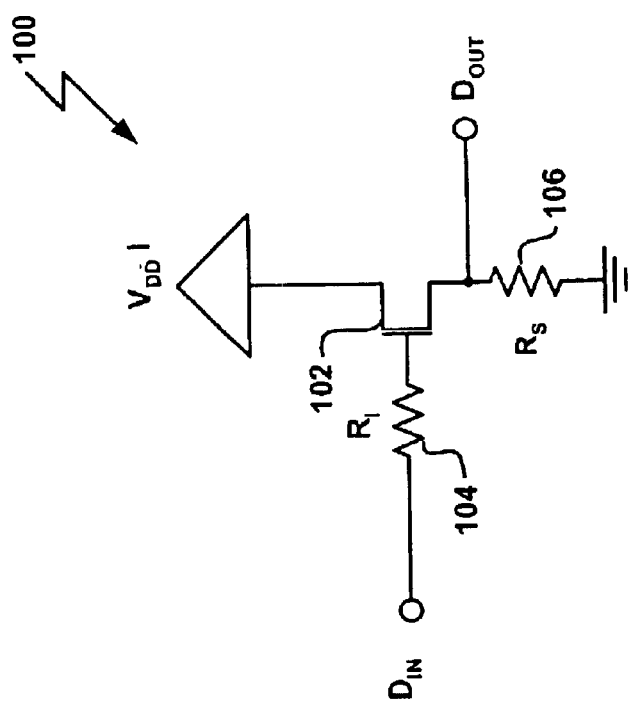
FIG. 4 is a circuit diagram illustrating another example of a conventional level shifting input receiver circuit configured to receive a signal from an output driver circuit operating using a different power supply voltage level and logic voltage level from that of the receiver circuit.
Figure 3:
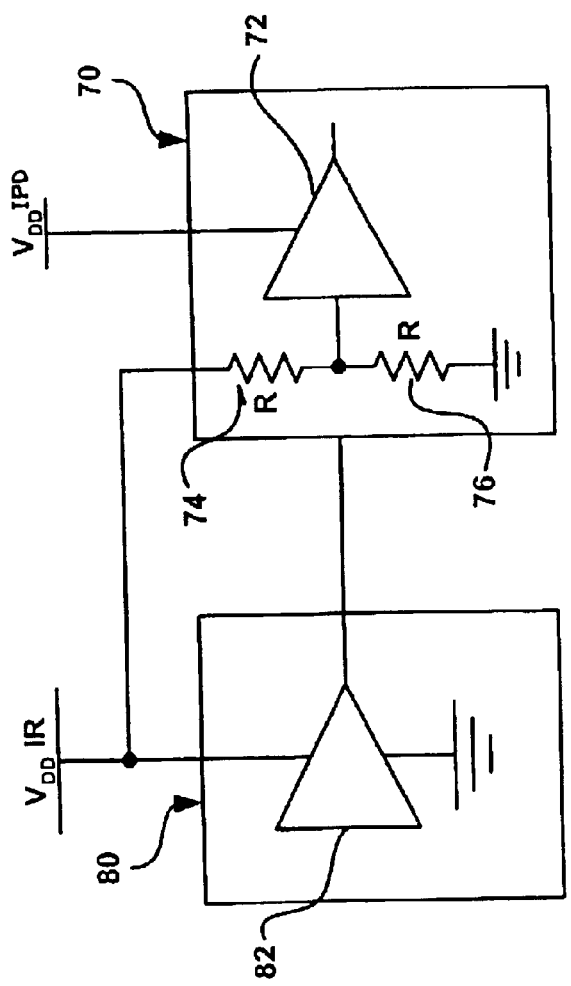
FIG. 3 is a circuit diagram illustrating an example of a conventional level shifting input receiver circuit configured to receive a signal from an output driver circuit operating using a different power supply voltage level and logic voltage level from that of the receiver circuit.
Figure 5:
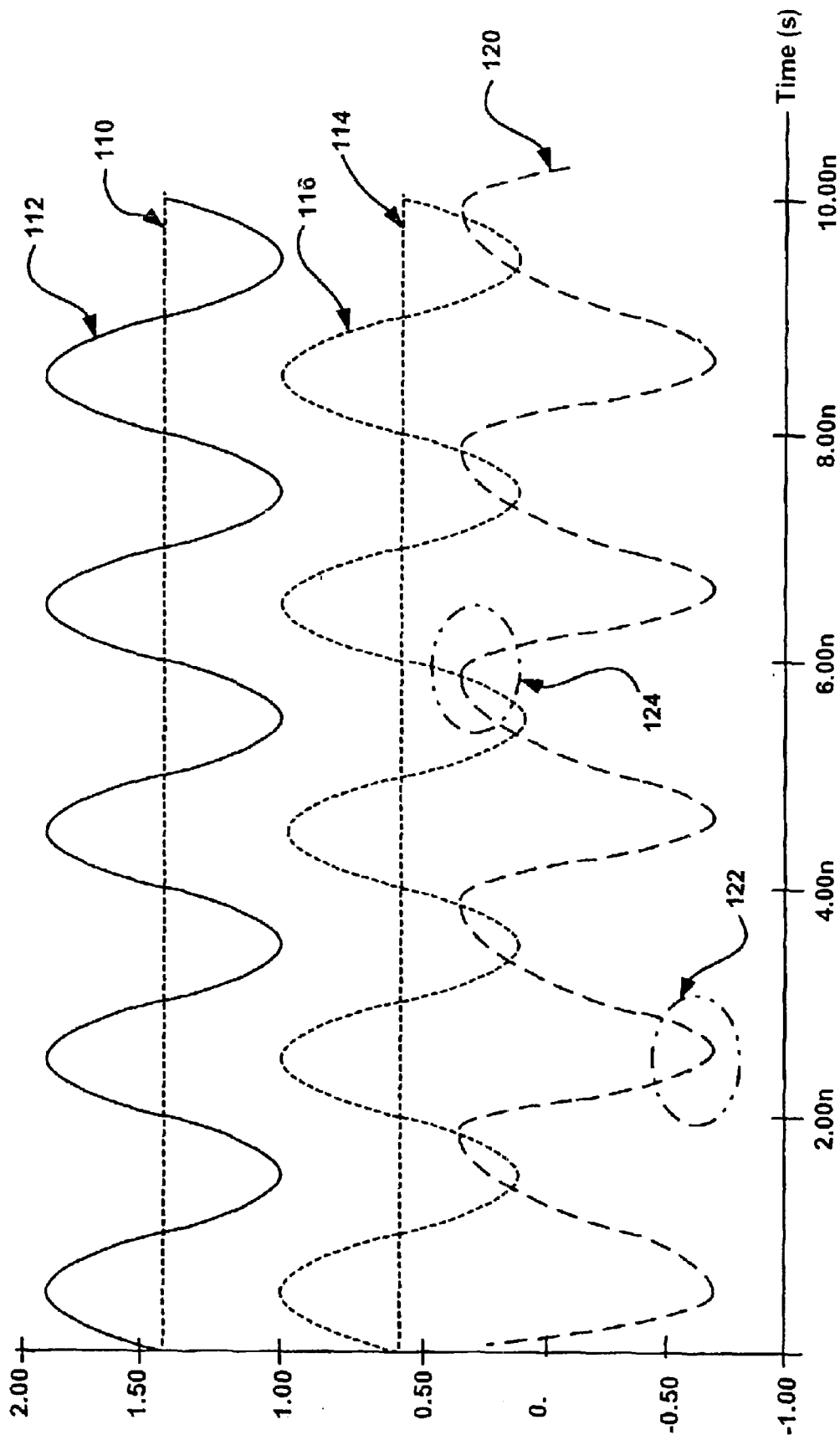
FIG. 5 is a waveform diagram illustrating an input data signal, intermediate circuit node signals, and the distortion that may be introduced to a resulting output signal by a conventional level shifting input receiver circuit.
Figure 6:
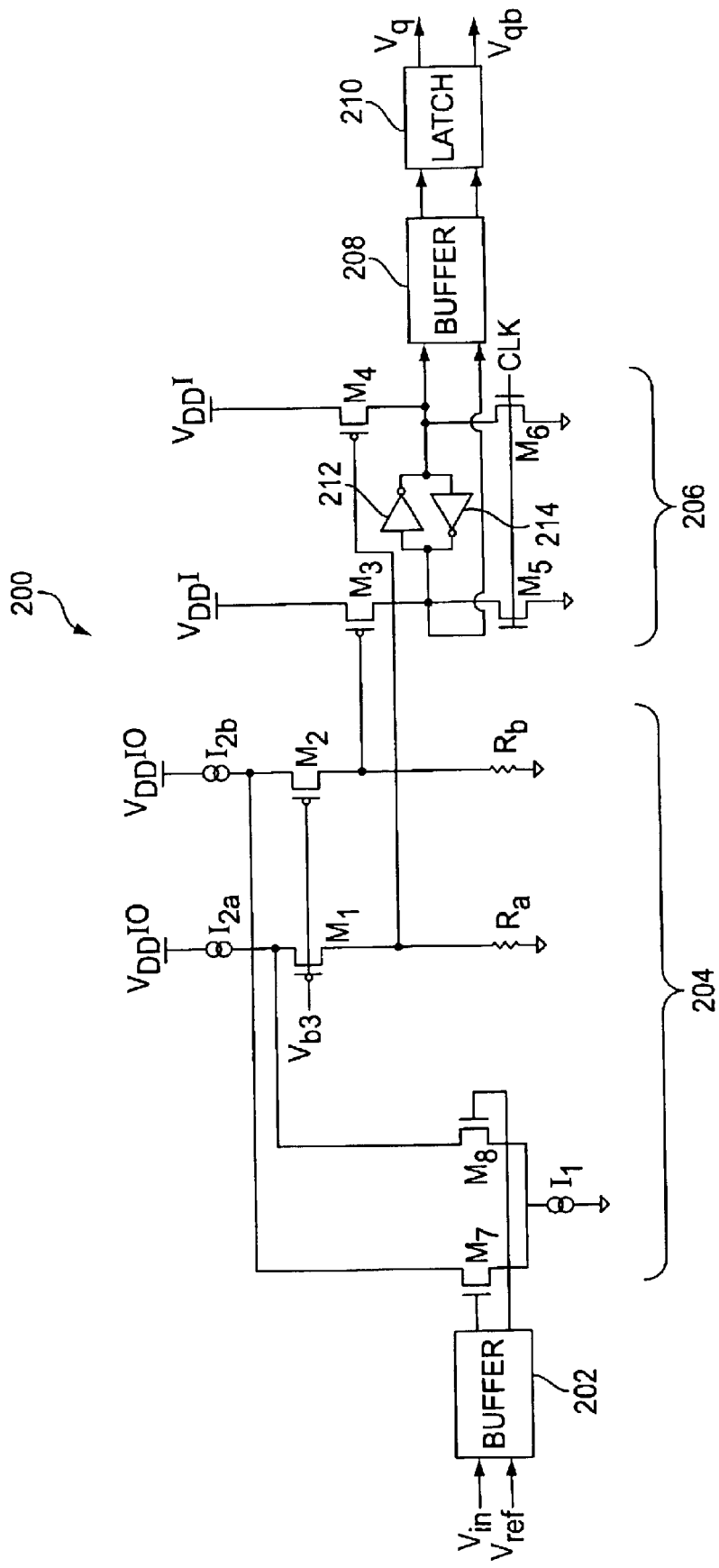
FIG. 6 is a schematic diagram of an embodiment of an input sampler circuit in accordance with the present invention.

Referring to FIG. 6, there is shown schematic diagram of an embodiment of an input sampler circuit 200 in accordance with the present invention. The input sampler circuit 200 comprises input buffering circuitry 202, a folded cascode gain and level shifting stage 204, a clocked sense amplifier stage 206, output buffering circuitry 208, and output latching circuitry 210. The input buffering circuitry 202 and the folded cascode gain and level shifting stage 204 operate from an external voltage supply $V_{DD}IO$ (e.g., 1.8V), while the clocked sense amplifier stage 206, the output buffering circuitry 208, and the output latching circuitry 210 operate from an internal voltage supply $V_{DD}I$ (e.g., 1.2V).

The input buffering circuitry 202 receives an input voltage signal $V_{in}$, (see FIG. 9 for voltage waveform), which is typically a data signal but may also be a control or other type of signal. The input buffering circuitry 202 also receives an input voltage reference $V_{ref}$ (e.g., 1.4V steady state voltage reference) (see FIG. 9 for voltage waveform). At this point it should be noted that input voltage reference $V_{ref}$ may also be a control or data reference signal such as, for example, a clock signal.

The input buffering circuitry 202 buffers the input voltage signal $V_{in}$ and the input voltage reference $V_{ref}$ such that the buffered input voltage reference $V_{ref}$ is the complement of the buffered input voltage signal $V_{in}$. The input buffering circuitry 202 may include adaptive swing limiting circuitry such as described in U.S. patent application Ser. No. 10/184,148, filed Jun. 27, 2002, entitled, "A Circuit, Apparatus and Method for an Adaptive Voltage Swing Limiter", which is hereby incorporated by reference herein in its entirety. The input buffering circuitry 202 buffers the input voltage signal $V_{in}$ and the input voltage reference $V_{ref}$ for use by the folded cascode gain and level shifting stage 204.

The folded cascode gain and level shifting stage 204 receives a buffered input voltage signal $V_{in}$ and a buffered input voltage reference $V_{ref}$ from the input buffering circuitry 202. At this point, the voltage levels of the buffered input voltage signal $V_{in}$ and the buffered input voltage reference $V_{ref}$ still refer to external voltage supply $V_{DD}IO$.

Figure 7:
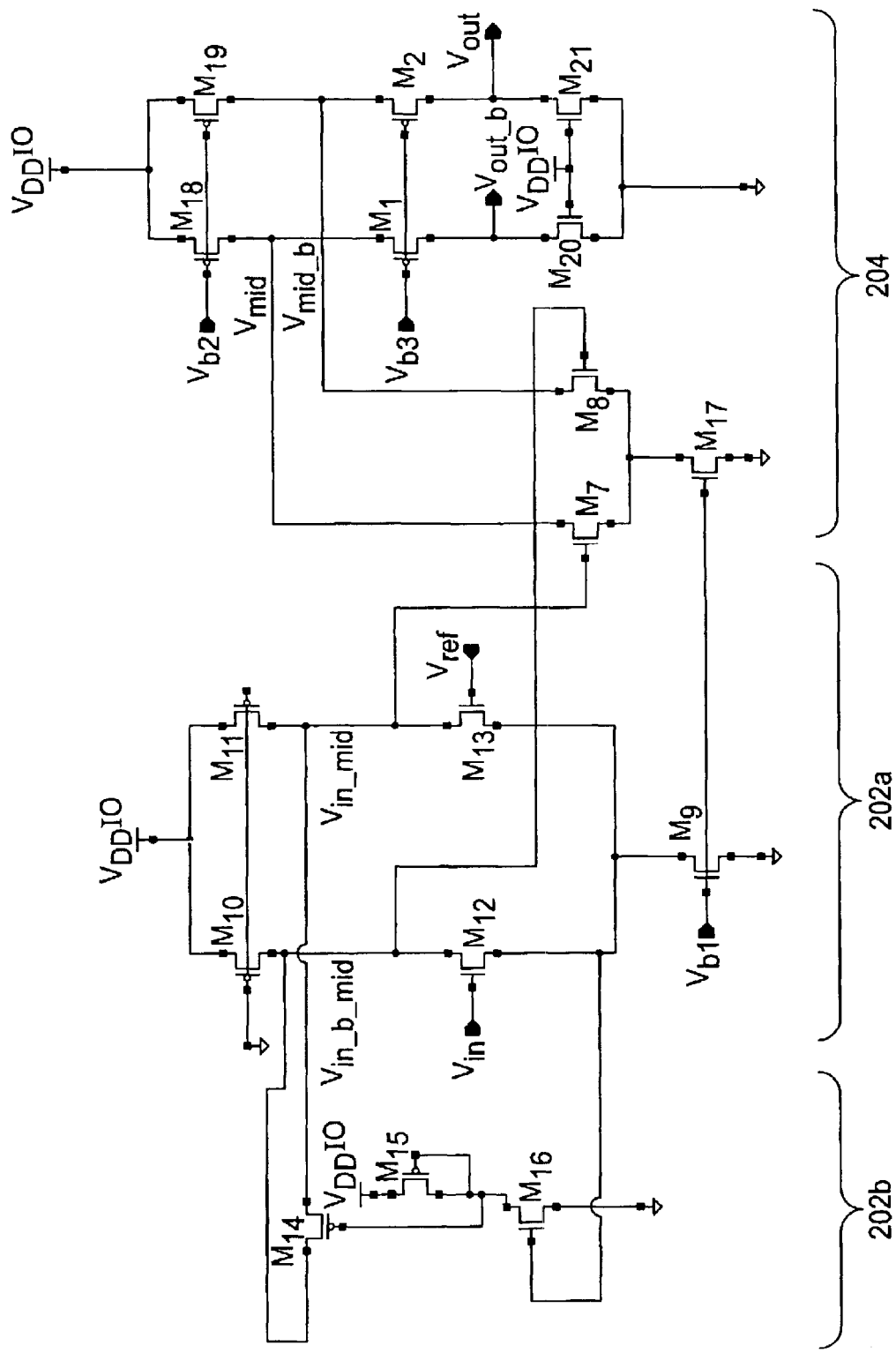
FIG. 7 is a more detailed schematic diagram of the input buffering circuitry and the folded cascode gain and level shifting stage of the embodiment of the input sampler circuit shown in FIG. 6.

The folded cascode gain and level shifting stage 204 simultaneously amplifies and level shifts the buffered input voltage signal $V_{in}$ and the buffered input voltage reference $V_{ref}$. The buffered input voltage signal $V_{in}$ and the buffered input voltage reference $V_{ref}$ are converted into current signals by differential transistor pair $M_7$ and $M_8$ and current source $I_1$. The resulting current signals are then processed by transistors $M_1$ and $M_2$, resistive loads $R_a$ and $R_b$ (the resistive loads may be implemented using transistors, as shown in FIG. 7), and current sources $I_{2a}$ and $I_{2b}$, and converted back into voltage signals. The voltage levels of these resulting voltage signals refer to ground. Thus, the folded cascode stage 204 shifts voltage levels referring to $V_{DD}IO$ into voltage levels referring to ground.

The clocked sense amplifier stage 206 receives the level shifted input voltage signal $V_{in}$ and the level shifted input voltage reference $V_{ref}$ from the folded cascode gain and level shifting stage 204. The clocked sense amplifier stage 206 samples the voltage levels of the level shifted input voltage signal $V_{in}$ and the level shifted input voltage reference $V_{ref}$ on a periodic basis in accordance with the period of external clock signal CLK (see FIG. 10C for voltage waveform). The clocked sense amplifier stage 206 utilizes a pair of PMOS transistors $M_3$ and $M_4$ for sensing the voltage levels of the level shifted input voltage signal $V_{in}$ and the level shifted input voltage reference $V_{ref}$. The clocked sense amplifier stage 206 utilizes a pair of NMOS transistors $M_5$ and $M_6$ and a pair of inverter devices 212 and 214 for amplifying the sensed voltage levels on a periodic basis in accordance with the period of the external clock signal CLK, which is applied directly to the pair of NMOS transistors $M_5$ and $M_6$.

The output buffering circuitry 208 receives the periodically sampled input voltage signal $V_{in}$ and the periodically sampled input voltage reference $V_{ref}$ from the clocked sense amplifier stage 206. The output buffering circuitry 208 buffers the periodically sampled input voltage signal $V_{in}$ and the periodically sampled input voltage reference $V_{ref}$ so as to condition the periodically sampled input voltage signal $V_{in}$ and the periodically sampled input voltage reference $V_{ref}$ and thereby provide stable input signals to the output latching circuitry 210.

The output latching circuitry 210 receives the buffered input voltage signal $V_{in}$ and the buffered input voltage reference $V_{ref}$ from the output buffering circuitry 208. The output latching circuitry 210 latches the buffered input voltage signal $V_{in}$ and the buffered input voltage reference $V_{ref}$ at their complementary logic states within the level of the internal voltage supply $V_{DD}I$ (e.g., 1.2V)

Referring to FIG. 7, there is shown a more detailed schematic diagram of the input buffering circuitry 202 and the folded cascode gain and level shifting stage 204 of the embodiment of the input sampler circuit 200 shown in FIG. 6. The input buffering circuitry 202 comprises buffer circuitry 202a, along with adaptive swing limiting circuitry 202b. As mentioned above, the adaptive swing limiting circuitry 202b may be of the type described in U.S. patent application Ser. No. 10/184,148, which was earlier incorporated by reference herein in its entirety.

The buffer circuitry 202a utilizes a current source implemented with a transistor $M_9$ driven by an external bias voltage $V_{b1}$ (e.g., 0.6V). The buffer circuitry 202a also utilizes resistive loads that are implemented with a pair of transistors $M_{10}$ and $M_{11}$ each having their sources coupled to external voltage supply $V_{DD}IO$ and their gates coupled to ground. The drain of transistor $M_{10}$ is coupled to the drain of input transistor $M_{12}$, and the drain of transistor $M_{11}$ is coupled to the drain of input transistor $M_{13}$. The pair of transistors $M_{10}$ and $M_{11}$ are configured to operate in their linear range in order to provide a resistive load that is driven by the amplifier formed in the buffer circuitry 202a, formed by input differential pair transistors $M_{12}$ and $M_{13}$ in combination with the current source implemented with transistor $M_9$ driven by external bias voltage $V_{b1}$.

Figure 9:
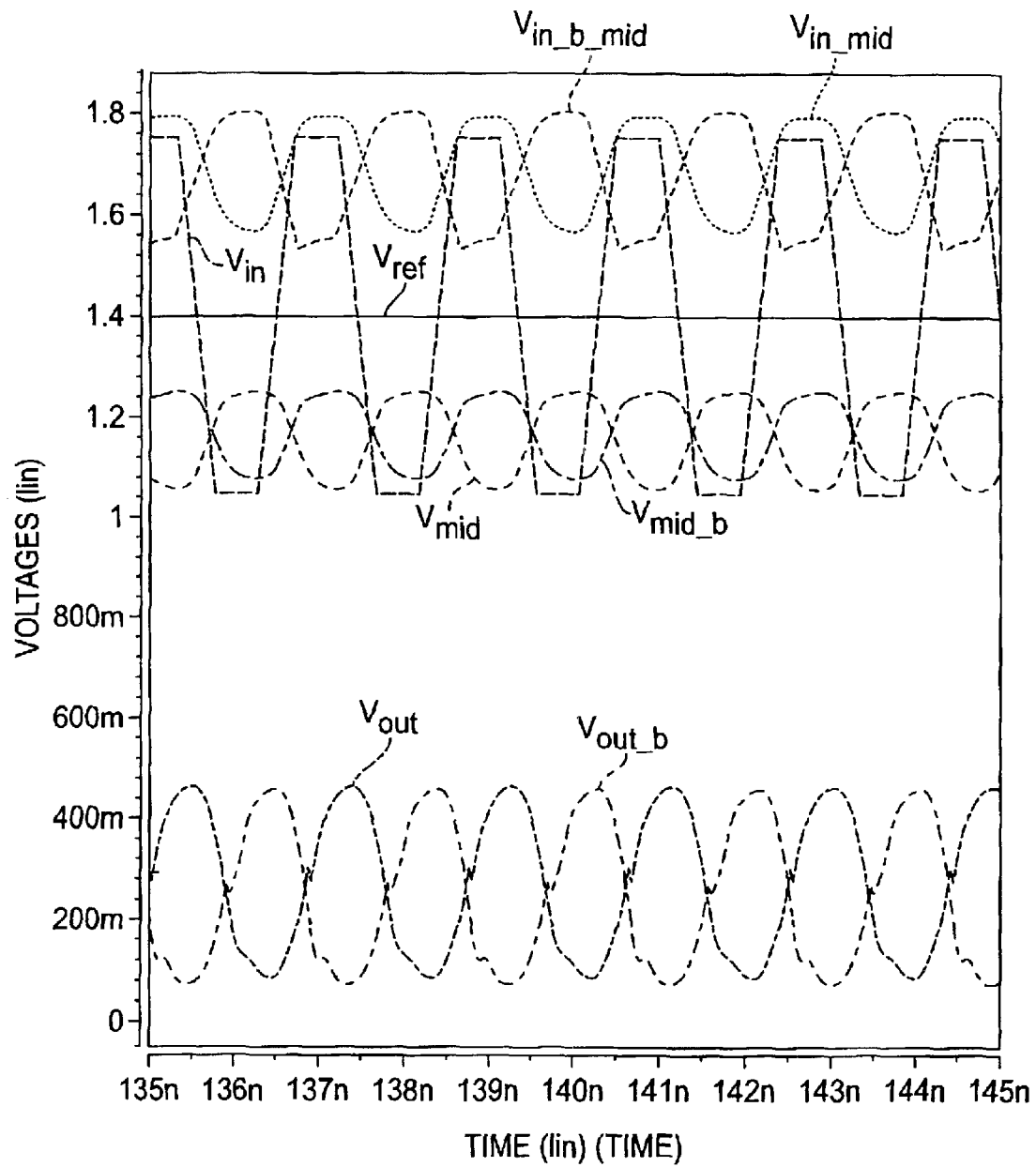
FIG. 9 shows voltage waveforms for the input voltage signal $V_{in}$, the input voltage reference $V_{ref}$, the complementary voltage signals $V_{in\_mid}$ and $V_{in\_b\_mid}$, the complementary voltage signals $V_{mid}$ and $V_{mid\_b}$, and the complementary voltage signals $V_{out}$ and $V_{out\_b}$ shown in FIG. 7.

The adaptive swing limiting circuitry 202b utilizes a plurality of transistors $M_{14}$–$M_{16}$ configured to adaptively limit the voltage swing between complementary voltage signals $V_{in\_mid}$ and $V_{in\_b\_mid}$ (see FIG. 9 for voltage waveforms).

Figure 10A:
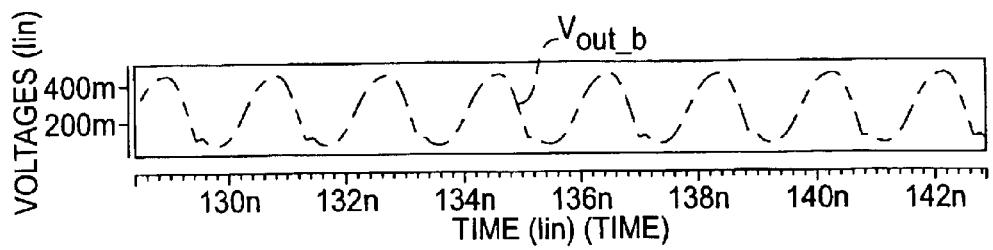
FIGS. 10A-10H show voltage waveforms for the complementary voltage signals $V_{out}$ and $V_{out\_b}$, the external clock signal CLK, the sense amplifier output voltage signals $V_{ou}$ and $V_{ou\_b}$, and the latched voltage signals $V_{baa}$ and $V_{bab}$ shown in FIG. 8.
Figure 10B:
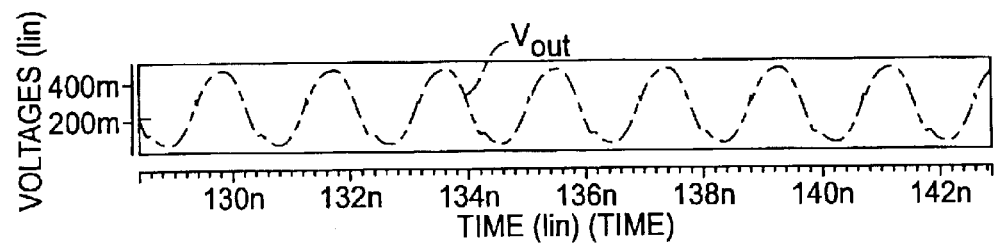
Figure 10C:
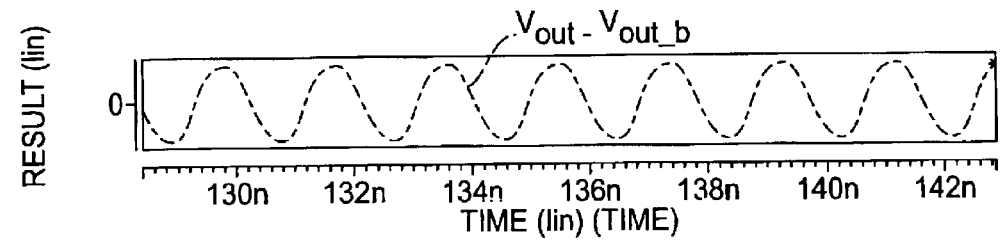
Figure 10D:
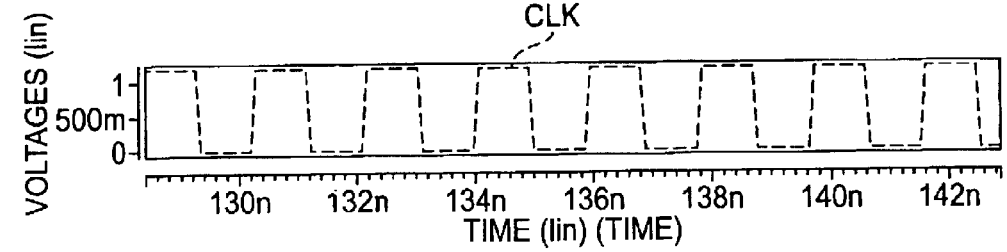

The folded cascode gain and level shifting stage 204 as shown in FIG. 7 is substantially as shown in FIG. 6, except that FIG. 7 shows that current source $I_1$ is implemented with a transistor $M_{17}$ driven by external bias voltage $V_{b1}$, that the pair of current sources $I_{2a}$ and $I_{2b}$ are implemented with a pair of transistors $M_{18}$ and $M_{19}$ driven by an external bias voltage $V_{b2}$ (e.g., 1.0V), and that the pair of resistive loads $R_a$ and $R_b$ are implemented using a pair of transistors $M_{20}$ and $M_{21}$ driven by the external voltage supply $V_{DD}IO$. FIG. 9 shows the voltage waveforms of the complementary voltage signals $V_{mid}$ and $V_{mid\_b}$ within the folded cascode gain and level shifting stage 204. FIGS. 9, 10A, and 10B show the voltage waveforms of the complementary voltage signals $V_{out}$ and $V_{out\_b}$ output from the folded cascode gain and level shifting stage 204.

Figure 8:
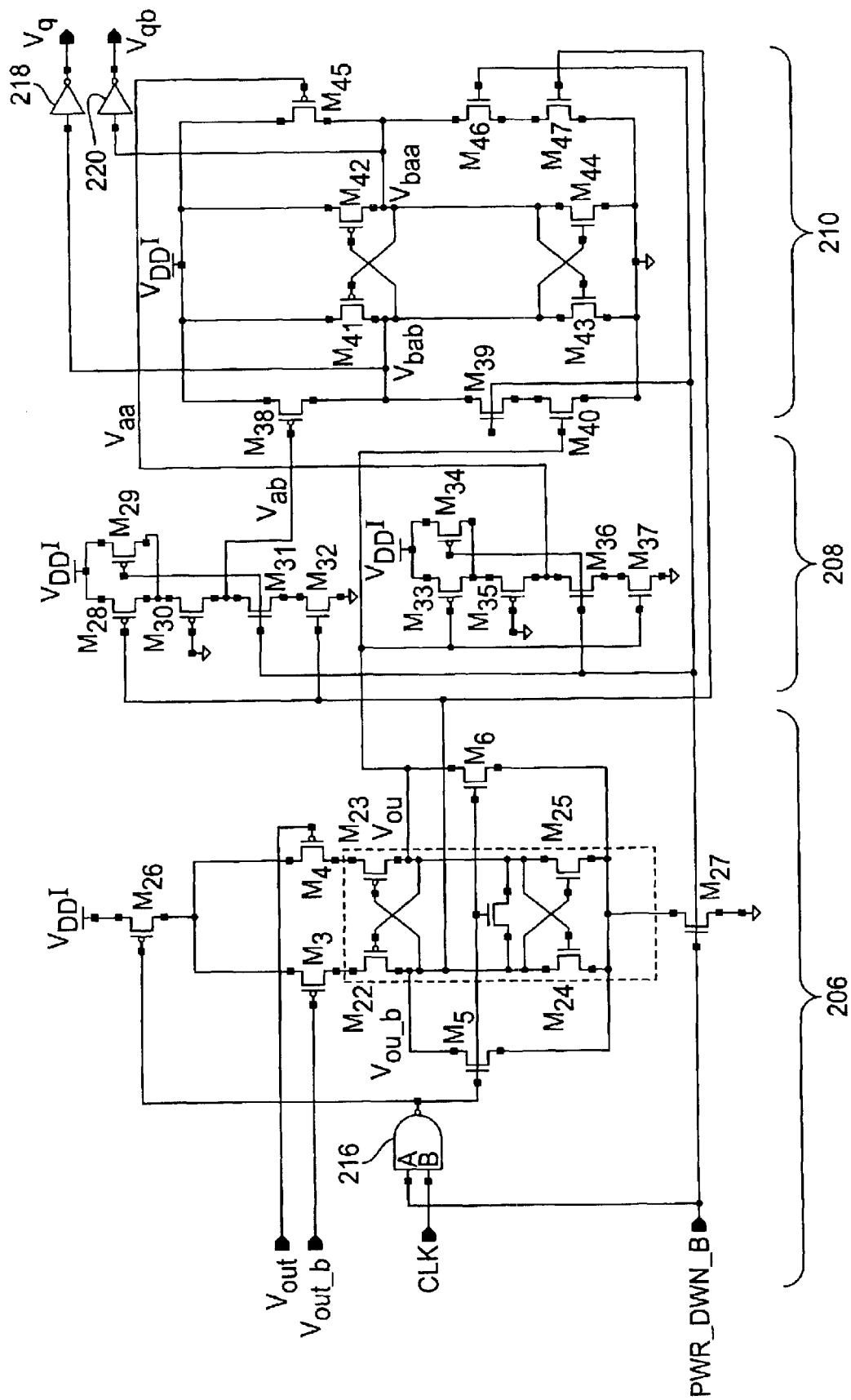
FIG. 8 is a more detailed schematic diagram of the clocked sense amplifier stage, the output buffering circuitry, and the output latching circuitry of the embodiment of the input sampler circuit shown in FIG. 6.

Referring to FIG. 8, there is shown a more detailed schematic diagram of the clocked sense amplifier stage 206, the output buffering circuitry 208, and the output latching circuitry 210 of the embodiment of the input sampler circuit 200 shown in FIG. 6. The clocked sense amplifier stage 206 as shown in FIG. 8 is substantially as shown in FIG. 6, except that FIG. 8 shows that the pair of inverter devices 212 and 214 are implemented with transistor pairs $M_{22}$ & $M_{23}$ and $M_{24}$ & $M_{25}$, respectively. Also, FIG. 8 shows optional power control circuitry comprising a NAND gate 216 and transistors $M_{26}$ and $M_{27}$ controlled by a power down control signal PWR_DWN_B, which maintains a logic high level during operation of the input sampler circuit 200.

Figure 10E:
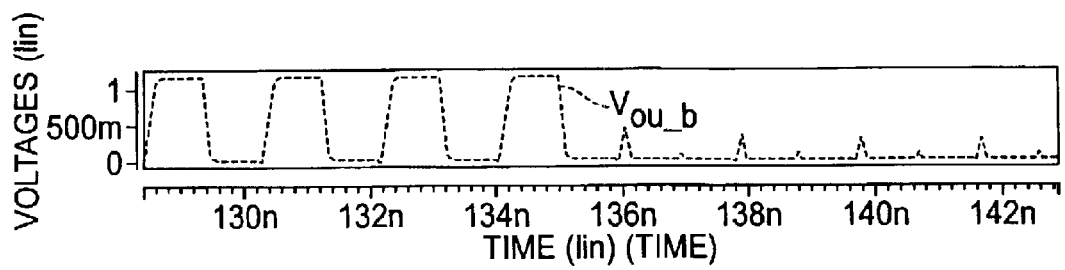
Figure 10F:
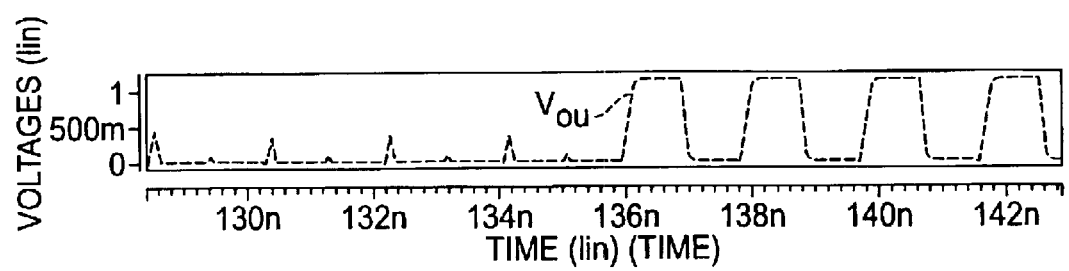

The output buffering circuitry 208 comprises a plurality of transistors $M_{28}$–$M_{37}$, which are configured to receive the periodically sampled input voltage signal $V_{in}$ and the periodically sampled input voltage reference $V_{ref}$ from the clocked sense amplifier stage 206. Transistors $M_{29}$, $M_{31}$, $M_{34}$, and $M_{36}$ are part of the optional power control circuitry, and are coupled directly to and controlled by the power down control signal PWR_DWN_B. The periodically sampled input voltage signal $V_{in}$ and the periodically sampled input voltage reference $V_{ref}$ are represented by complementary signals $V_{ou}$ and $V_{ou\_b}$, respectively, and are shown in FIGS. 10E and 10F.

Figure 10G:
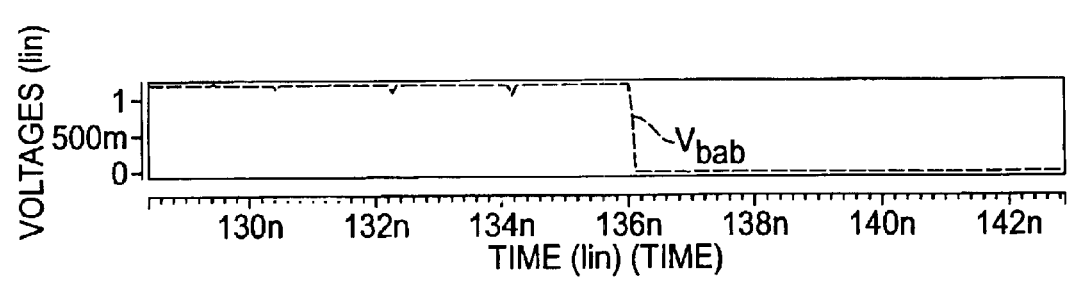
Figure 10H:
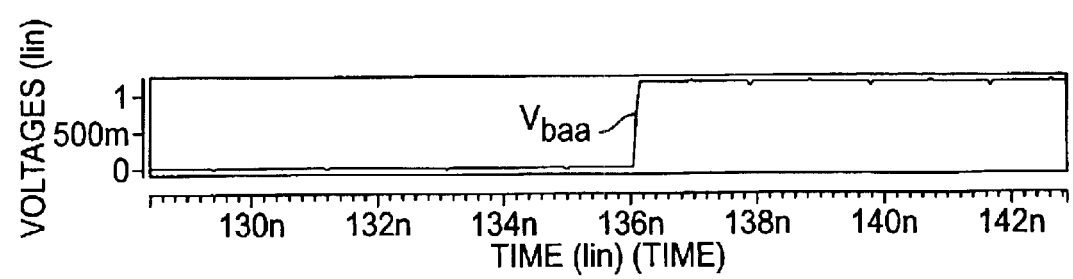

The output latching circuitry 210 comprises a plurality of transistors $M_{38}$–$M_{47}$ and a pair of output inverters 218 and 220, which all configured to receive the buffered input voltage signal $V_{in}$ and the buffered input voltage reference $V_{ref}$ from the output buffering circuitry 208. Transistors $M_{39}$ and $M_{46}$ are part of the optional power control circuitry, and are coupled directly to and controlled by the power down control signal PWR_DWN_B. The level shifted and latched input voltage signal $V_{in}$ and the level shifted and latched input voltage reference $V_{ref}$, prior to inversion by the pair of output inverters 218 and 220, are represented by level shifted and latched voltage signals $V_{baa}$ and $V_{bab}$, respectively, and are shown in FIGS. 10G and 10H.

At this point it should be noted that although all of the transistors in FIGS. 6-8 are shown being implemented using CMOS technology (i.e., NMOS and PMOS transistors), it is within the scope of the present invention to implement some or all of the transistors shown in FIGS. 6-8 using bipolar technology.

At this point it should be noted that the present invention pseudo cascode level shifting circuit may be used with standard logic level signals or with multilevel logic signals in a multilevel signaling system.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A pseudo folded cascode level shifting circuit comprising:
   a first differential amplifier having first and second input terminals, first and second current sinking terminals, and first and second current sourcing terminals, the first input terminal for receiving a single-ended input signal, the second input terminal for receiving a single-ended reference signal;
   a second differential amplifier having first and second input terminals, first and second current sinking terminals, and first and second current sourcing terminals, the first and second input terminals of the second differential amplifier coupled to the first and second current sinking terminals of the first differential amplifier, respectively;
   a first current source having a control terminal for receiving a first bias control signal, and a current sinking terminal coupled to the first and second current sourcing terminals of the second differential amplifier;
   a second current source having a control terminal for receiving a second bias control signal, a current sinking terminal coupled to a power supply, and a current sourcing terminal coupled to the first current sinking terminal of the second differential amplifier;
   a third current source having a control terminal for receiving the second bias control signal, a current sinking terminal coupled to the power supply, and a current sourcing terminal coupled to the second current sinking terminal of the second differential amplifier;
   a first transistor having a control terminal for receiving a third bias control signal, a current sinking terminal coupled to the current sourcing terminal of the second current source and to the first current sinking terminal of the second differential amplifier, and a current sourcing terminal;
   a second transistor having a control terminal for receiving the third bias control signal, a current sinking terminal coupled to the current sourcing terminal of the third current source and to the second current sinking terminal of the second differential amplifier, and a current sourcing terminal;
   a first load coupled to the current sourcing terminal of the first transistor; and
   a second load coupled to the current sourcing terminal of the second transistor.

2. The pseudo folded cascode level shifting circuit as defined in claim 1, wherein the single-ended input signal is a data signal.

3. The pseudo folded cascode level shifting circuit as defined in claim 1, wherein the single-ended reference signal is one of a steady state voltage reference signal, a control reference signal, and a data reference signal.

4. The pseudo folded cascode level shifting circuit as defined in claim 1, wherein the first load comprises:
   a third transistor having a control terminal coupled to the power supply, a current sinking terminal coupled to the current sourcing terminal of the first transistor, and a current sourcing terminal.

5. The pseudo folded cascode level shifting circuit as defined in claim 4, wherein the third transistor is an NMOS transistor.

6. The pseudo folded cascode level shifting circuit as defined in claim 1, wherein the second load comprises:
   a third transistor having a control terminal coupled to the power supply, a current sinking terminal coupled to the current sourcing terminal of the second transistor, and a current sourcing terminal.

7. The pseudo folded cascode level shifting circuit as defined in claim 6, wherein the third transistor is an NMOS transistor.

8. The pseudo folded cascade level shifting circuit as defined in claim 1, wherein the first transistor is a PMOS transistor.

9. The pseudo folded cascode level shifting circuit as defined in claim 1, wherein the second transistor is a PMOS transistor.

10. The pseudo folded cascode level shifting circuit as defined in claim 1, wherein the first current source is an NMOS transistor.

11. The pseudo folded cascode level shifting circuit as defined in claim 1, wherein the second current source is a PMOS transistor.

12. The pseudo folded cascode level shifting circuit as defined in claim 1, wherein the third current source is a PMOS transistor.

13. A method for voltage level shifting input signals, the method comprising the steps of:
   receiving first and second input signals having first and second input voltage levels, respectively;

differentially amplifying the first and second input signals via a first differential transistor pair so as to generate first and second amplified voltage signals having first and second amplified voltage levels, respectively, wherein the first and second amplified voltage signals are substantially complementary; and differentially level shifting the first and second amplified voltage signals via a second differential transistor pair so as to generate first and second level shifted amplified voltage signals having first and second level shifted amplified voltage levels, respectively, wherein the first and second level shifted amplified voltage signals are substantially complementary and the first and second level shifted amplified voltage levels are lower than the first and second input voltage levels, respectively.

14. The method as defined in claim 13, wherein the first input signal is a data signal and the second input signal is a reference signal.

15. The method as defined in claim 14, wherein the reference signal is one of a steady state voltage reference signal, a control reference signal, and a data reference signal.

16. The method as defined in claim 13, further comprising the step of:

coupling the first and second level shifted amplified voltage signals to a pair of PMOS transistor devices.

17. A method for voltage level shifting input signals, the method comprising the steps of:

receiving first and second input voltage signals having first and second input voltage levels, respectively;

differentially amplifying the first and second input voltage signals via a first differential transistor pair so as to generate first and second amplified voltage signals having first and second amplified voltage levels, respectively, wherein the first and second amplified voltage signals are substantially complementary; and differentially level shifting the first and second amplified voltage signals via a second differential transistor pair so as to generate first and second output voltage signals having first and second output voltage levels, respectively, wherein the first and second output voltage signals are substantially complementary and the first and second output voltage levels are lower than the first and second input voltage levels, respectively.

18. The method as defined in claim 17, wherein the first input voltage signal is a data signal and the second input voltage signal is a reference signal.

19. The method as defined in claim 18, wherein the reference signal is one of a steady state voltage reference signal, a control reference signal, and a data reference signal.

20. The method as defined in claim 17, further comprising the step of:

coupling the first and second output voltage signals to a pair of PMOS transistor devices.

21. The pseudo folded cascode level shifting circuit as defined in claim 1, further comprising:

a fourth current source having a control terminal for receiving the first bias control signal, and a current sinking terminal coupled to the first and second current sourcing terminals of the first differential amplifier.

22. The pseudo folded cascode level shifting circuit as defined in claim 1, further comprising:

adaptive swing limiting circuitry coupled to the first and second current sinking terminals of the first differential amplifier for adaptively limiting voltage swing between complementary voltage signals in the first differential amplifier.

23. The method as defined in claim 13, further comprising the step of:

adaptively limiting voltage swing between the first and second amplified voltage signals.

24. The method as defined in claim 17, further comprising the step of:

adaptively limiting voltage swing between the first and second amplified voltage signals.

* * * * *